(12) United States Patent
Wang

(10) Patent No.: US 9,591,759 B2
(45) Date of Patent: Mar. 7, 2017

(54) CIRCUIT BOARD

(71) Applicant: EMCOM TECHNOLOGY INC., Taipei (TW)

(72) Inventor: Chu-Li Wang, Taipei (TW)

(73) Assignee: EMCOM TECHNOLOGY INC., Taipei (TW)

( * ) Notice: Subject to any disclaimer, the term of this patent is extended or adjusted under 35 U.S.C. 154(b) by 0 days.

(21) Appl. No.: 14/740,360

(22) Filed: Jun. 16, 2015

(65) Prior Publication Data

US 2016/0344363 A1    Nov. 24, 2016

(30) Foreign Application Priority Data

May 22, 2015 (TW) .............................. 104116527 A

(51) Int. Cl.
*H01P 1/00* (2006.01)
*H05K 1/16* (2006.01)
*H01R 13/6464* (2011.01)

(52) U.S. Cl.
CPC ..................................... *H05K 1/16* (2013.01)

(58) Field of Classification Search
CPC ...... H01R 9/098; H01R 12/51; H01R 13/646; H01R 24/00
USPC ......... 333/260, 24 C; 439/676, 941; 174/262
See application file for complete search history.

(56) References Cited

U.S. PATENT DOCUMENTS

| | | | |
|---|---|---|---|
| 5,618,185 A | 4/1997 | Aekins | |
| 5,997,358 A | 12/1999 | Adriaenssens et al. | |
| 6,866,548 B2 * | 3/2005 | Hashim | H01R 13/6464 439/676 |
| 7,315,224 B2 * | 1/2008 | Gurovich | H05K 1/0228 333/101 |
| 7,360,308 B2 * | 4/2008 | Oggioni | H01L 23/66 174/262 |
| 7,658,651 B2 | 2/2010 | Pepe et al. | |
| 7,677,930 B2 * | 3/2010 | Hashim | H05K 1/0228 439/676 |
| 7,736,195 B1 * | 6/2010 | Poulsen | H01R 13/6658 439/676 |
| 7,767,913 B2 * | 8/2010 | Corisis | H01L 23/66 174/260 |
| 7,927,153 B2 * | 4/2011 | Straka | H01R 13/6625 439/676 |
| 8,058,956 B2 * | 11/2011 | Jow | H01L 23/66 333/260 |
| 8,143,976 B2 * | 3/2012 | Wyland | H01L 23/66 333/260 |
| 8,421,551 B2 * | 4/2013 | Lascari | H01P 1/047 174/250 |

(Continued)

*Primary Examiner* — Dean Takaoka

(57) ABSTRACT

A circuit board for a communication connector, comprising a first signal input terminal, a first signal output terminal, a second signal input terminal, a second signal output terminal, a first signal wire, a second signal wire, a capacitive structure and a capacitive cylinder. The first signal input terminal and the first signal output terminal are coupled by the first signal wire; the second signal input terminal and the second signal output terminal are coupled by the second signal wire; the capacitive structure is coupled with the first signal wire; the capacitive cylinder is coupled with second signal wire. The capacitive structure and the capacitive cylinder are capacitive coupled between the first signal wire and the second signal wire.

20 Claims, 14 Drawing Sheets

(56) References Cited

U.S. PATENT DOCUMENTS 8,502,085 B2 * 8/2013 Kim .................... H05K 1/0219
174/262
9,356,396 B2 * 5/2016 Bolouri-Saransar H01R 13/6466

* cited by examiner

CIRCUIT BOARD

BACKGROUND OF THE INVENTION

1. Field of the Invention

The invention relates to a circuit board using for a communication connector. More specifically, it relates to a circuit board with a circular capacitor and a via capacitor.

2. Description of the Prior Art

Generally, high frequency signals are transmitted by a connecting wire and a connector, wherein the crosstalk signal interference is reduced by making capacitors couple on the circuit board. As shown in FIG. 1A, the connector has a plug (not shown) and a jack 1. Generally speaking, the plug comprises a plurality of conducting wires, wherein the conducting wires are paralleled with each other. The jack 1 comprises a body 11 and a circuit board 12 (e.g. (printed circuit board, PCB)). Recently, making capacitors on the circuit board of the plug is to use parallel plate capacitors (U.S. Pat. No. 7,658,651), interdigital capacitors (U.S. Pat. No. 5,997,358), or via capacitors (U.S. Pat. No. 5,618,185). As shown in FIG. 1B-FIG. 1D, FIG. 1B is a schematic diagram of a known interdigital capacitor. FIG. 1C is a schematic diagram of a known parallel plate capacitor (dashed mark). FIG. 1D is a schematic diagram of a known via capacitor.

However, with the raise of the frequency, the crosstalk interference is more serious so that the much larger coupled capacitance is needed to suppress the crosstalk signal interference. Accordingly, the area of the known capacitor will increase so that the error from process will increase. Therefore, how to raise the capacitance area efficiency to reduce the cost and error is an important issue which the applicant concerns about.

SUMMARY OF THE INVENTION

Accordingly, in one aspect, the invention provides a circuit board for the communication connector, comprising a first signal input terminal, a first signal output terminal, a second signal input terminal, a second signal output terminal, a first signal wire, a second signal wire, a capacitive structure and a capacitive cylinder. The first signal input terminal and the first signal output terminal are coupled by the first signal wire; the second signal input terminal and the second signal output terminal are coupled by the second signal wire; the capacitive structure is coupled with the first signal wire; the capacitive cylinder is coupled with second signal wire.

Wherein the capacitive structure and the capacitive cylinder are capacitive coupled between the first signal wire and the second signal wire.

In another aspect, the invention provides a circuit board for the communication connector, comprising a first signal input terminal, a first signal output terminal, a second signal input terminal, a second signal output terminal, a first signal wire, a second signal wire, a capacitive structure, a first capacitive cylinder and at least one second capacitive cylinder. The first signal input terminal and the first signal output terminal are coupled by the first signal wire; the second signal input terminal and the second signal output terminal are coupled by the second signal wire; the capacitive structure is coupled with the first signal wire; the first capacitive cylinder is coupled with the second signal wire; the at least one second capacitive cylinder is coupled with the capacitive structure.

Wherein the at least one second capacitive cylinder and the first capacitive cylinder are capacitive coupled between the first signal wire and the second signal wire.

In another aspect, the invention provides a circuit board for the communication connector, comprising a first signal input terminal, a first signal output terminal, a second signal input terminal, a second signal output terminal, a first signal wire, a second signal wire, a first capacitive structure, at least one capacitive cylinder, and a second capacitive structure. The first signal input terminal and the first signal output terminal are coupled by the first signal wire; the second signal input terminal and the second signal output terminal are coupled by the second signal wire; the first capacitive structure is coupled with the first signal wire; the at least one capacitive cylinder is coupled with the first capacitive structure; the second capacitive structure is coupled with the second signal wire.

Wherein the first capacitive structure and the second capacitive structure are capacitive coupled between the first signal wire and the second signal wire. The at least one capacitive cylinder and the second capacitive structure are capacitive coupled between the first signal wire and the second signal wire.

In another aspect, the invention provides a circuit board for the communication connector, comprising a first signal input terminal, a first signal output terminal, a second signal input terminal, a second signal output terminal, a first signal wire, a second signal wire, a first capacitive structure, a second capacitive structure, at least one first capacitive cylinder, and at least one second capacitive cylinder. The first signal input terminal and the first signal output terminal are coupled by the first signal wire; the second signal input terminal and the second signal output terminal are coupled by the second signal wire; the first capacitive structure is coupled with the first signal wire; the second capacitive structure is coupled with the second signal wire; the at least one first capacitive cylinder is coupled with the first capacitive structure; the at least one second capacitive cylinder is coupled with the second capacitive structure.

Wherein the at least one first capacitive cylinder and the at least one second capacitive cylinder are capacitive coupled between the first signal wire and the second signal wire.

In comparison to the prior art, the circuit board for the communication connector in the invention can effectively raise the area usage of the circuit board and reduce the capacitive deviation from process by using the circular capacitor and the via capacitor.

DETAILED DESCRIPTION OF THE PREFERRED EMBODIMENT

Figure 2A:
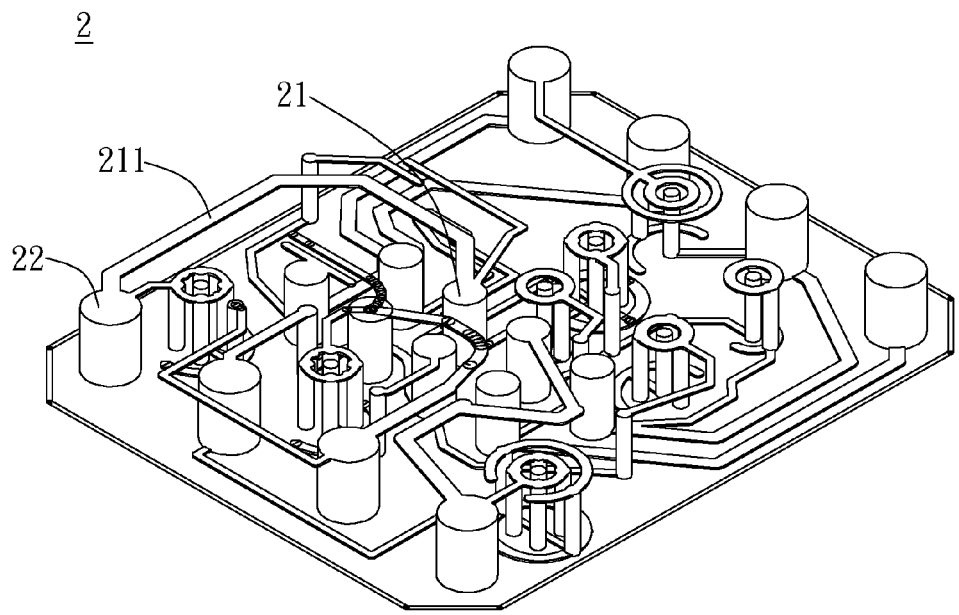
FIG. 2A is a three-dimension diagram in one embodiment of this invention.
Figure 2B:
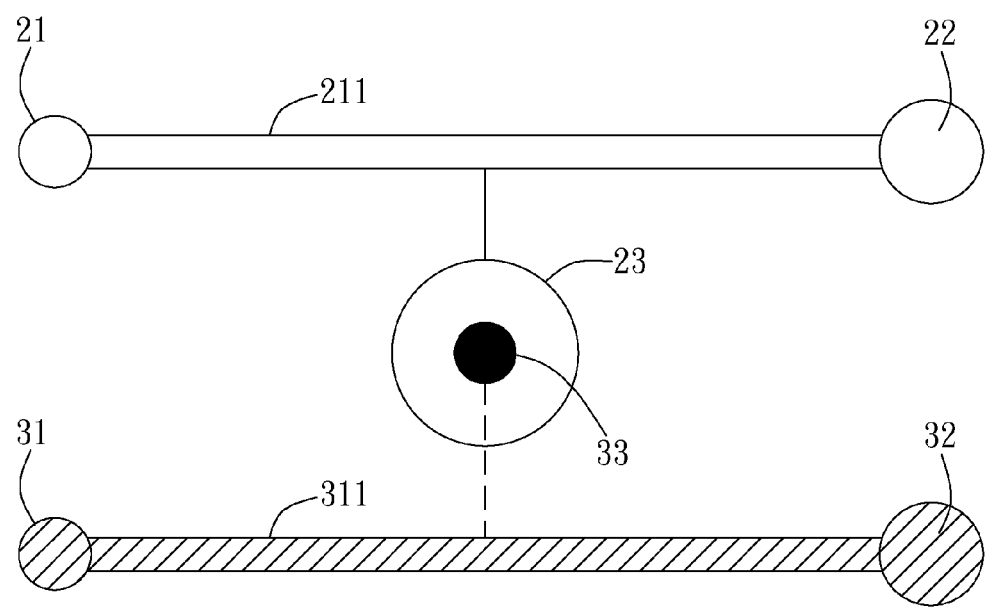
FIG. 2B and FIG. 2C are schematic diagrams in another embodiments of this invention.
Figure 2C:
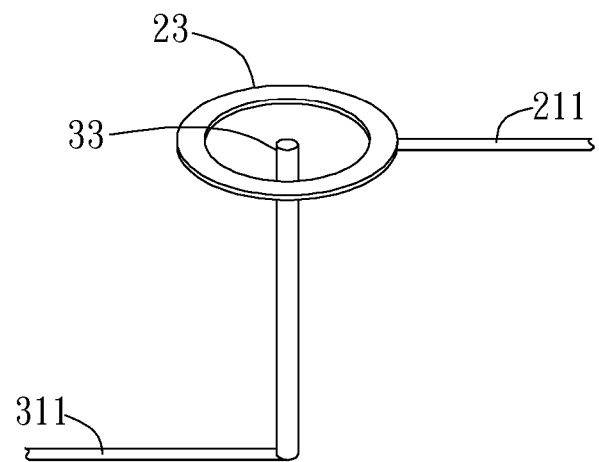

Please refer to FIG. 2A-FIG. 2C. FIG. 2A is a schematic diagram in one embodiment in this invention. FIG. 2B is a schematic diagram in one embodiment in this invention. FIG. 2C is a three-dimension diagram in the embodiment of FIG. 2B. As shown in FIG. 2A and FIG. 2B, a circuit board 2 in this embodiment is a rigid printed circuit board, but not limited thereto. The circuit board 2 preferably comprises a first signal input terminal 21, a first signal output terminal 22, a second signal input terminal 31, a second signal output terminal 32, a first signal wire 211, a second signal wire 311, a capacitive structure 23 and a capacitive cylinder 33. The first signal input terminal 21 and the first signal output terminal 22 are preferably disposed on the top layer of the circuit board 2 and coupled by the first signal wire 211. The second signal input terminal 31 and the second signal output terminal 32 are preferably disposed on the bottom layer of the circuit board 2 and coupled by the second signal wire 311.

As shown in FIG. 2C, the first signal wire 211 is connected to the capacitive structure 23 on the top layer of the circuit board 2. Wherein the capacitive structure 23 is a circular structure and close, but not limited thereto. The second signal wire 311 is connected to the capacitive cylinder 33 which passes through the top layer and the bottom layer of the circuit board 2. In this embodiment, the capacitive cylinder 33 can be a via capacitor for general printed circuit board. Accordingly, the capacitive cylinder 33 and the capacitive structure 23 can be capacitive coupled between the first signal wire 211 and the second signal wire 311.

It is noted that compared to the capacitive cylinder 33, the capacitive structure 23 surrounds the capacitive cylinder 33.

Figure 2D:
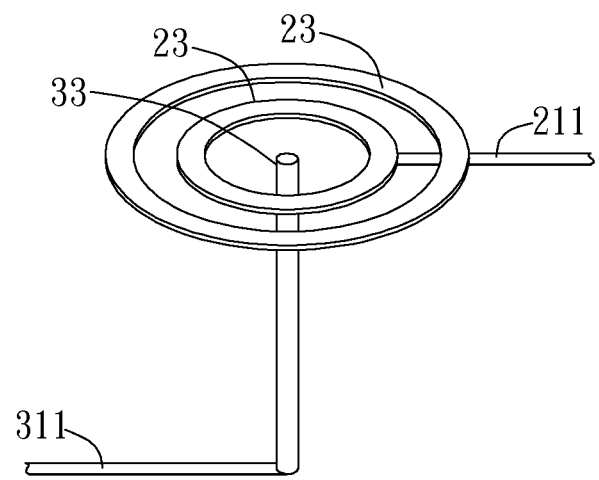
FIG. 2D is a schematic diagram in another embodiment of this invention.

In another embodiment of this invention, it can be designed to have a plurality of circular capacitive structure, i.e. changing the capacitive structure into two circular capacitive structures. As shown in FIG. 2D, capacitive structures 23 are also capacitive coupled with the capacitive cylinder 33. By this design, it can increase the capacitance.

Figure 2E:
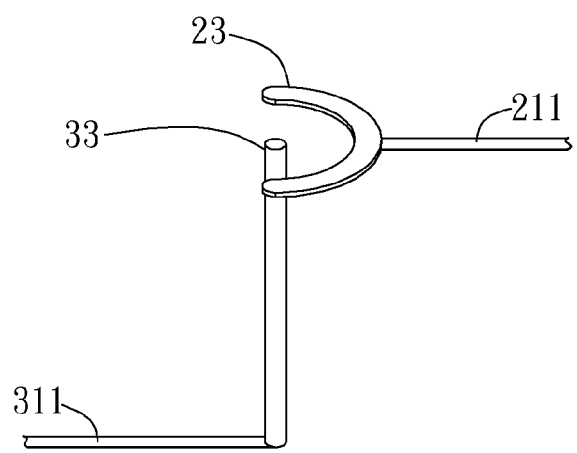
FIG. 2E is a schematic diagram in another embodiment of this invention.
Figure 2F:
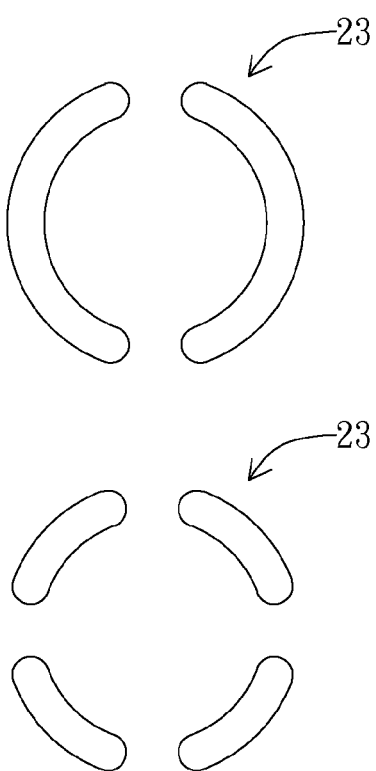
FIG. 2F is a schematic diagram in another embodiment of this invention.

In another embodiment of this invention, it changes the aspect of the capacitive structure. As shown in FIG. 2E, the capacitive structure 23 is open. In this embodiment, the shape is like a semicircle, but not limited thereto. However, in other embodiment, the shape can be designed to multiple gaps. As shown in FIG. 2F, the structure has multiple gaps. The shape of capacitive structure 23 can be designed to any layout by designer.

Figure 2G:
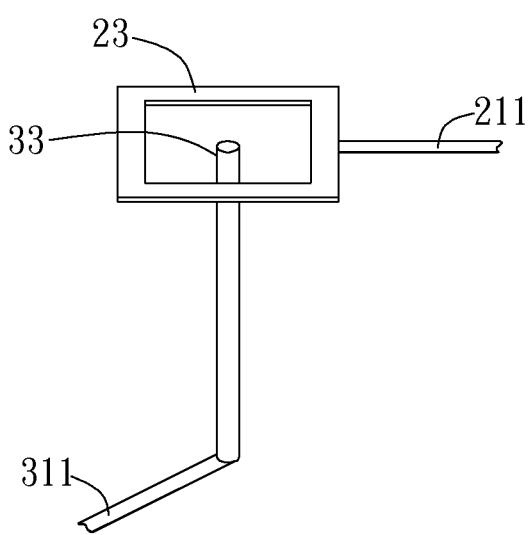
FIG. 2G is a schematic diagram in another embodiment of this invention.

It is noted that the circular capacitive structure in this invention is not limited to circle, as long as the capacitive structure surrounds the first capacitive cylinder. For example, as shown in FIG. 2G, the aspect of the capacitive structure 23 is a rectangle. It can also be capacitive coupled with the capacitive cylinder 33. In other embodiment, other polygon structure surrounds the capacitive cylinder has the same effect.

In another embodiment of this invention, the circuit board preferably comprises a first signal input terminal, a first signal output terminal, a second signal input terminal, a second signal output terminal, a first signal wire 211, a second signal wire 311, a capacitive structure 23, a first capacitive cylinder 33 and at least one second capacitive cylinder 231. The first signal input terminal and the first signal output terminal are coupled by the first signal wire 211; the second signal input terminal and the second signal output terminal are coupled by the second signal wire 311; the capacitive structure 23 is coupled with the first signal wire 211; the first capacitive cylinder 33 is coupled with the second signal wire 311; the at least one second capacitive cylinder 231 is coupled with the capacitive structure 23.

Figure 3A:
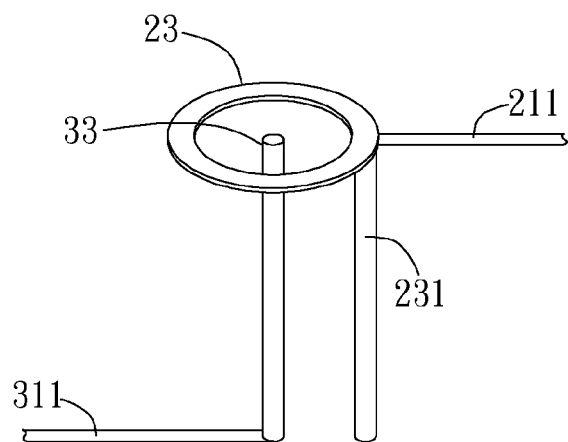
FIG. 3A is a schematic diagram in another embodiment of this invention.

As shown in FIG. 3A, the second capacitive cylinder 231 is connected to the capacitive structure 23. The second capacitive cylinder 231 can be a general via capacitor. Accordingly, the first capacitive cylinder 33 and the second capacitive cylinder 231 can be capacitive coupled between the first signal wire 211 and the second signal wire 311. In addition, when the capacitive structure 23 and the second capacitive cylinder 231 are considered together, they are capacitive coupled with the first capacitive cylinder 33. Wherein the capacitive structure 23 surrounds the first capacitive cylinder 33.

Figure 3B:
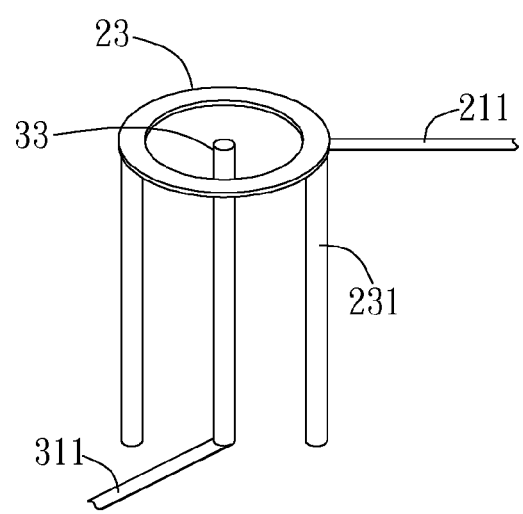
FIG. 3B is a schematic diagram in another embodiment of this invention.

In other embodiment, there are a plurality of second capacitive cylinders coupled with the capacitive structure to increase the capacitance. As shown in FIG. 3B, there are two second capacitive cylinders 231 coupled to the capacitive structure 23. In this condition, two second capacitive cylinders 231 both are capacitive coupled with the first capacitive cylinder 33. Similarly, when the capacitive structure 23 and two second capacitive cylinders 231 are considered together, they also are capacitive coupled with the first capacitive cylinder 33.

Figure 3C:
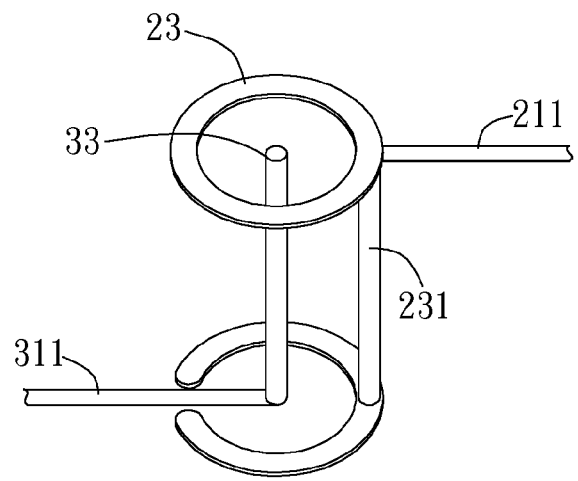
FIG. 3C is a schematic diagram in another embodiment of this invention.

In another embodiment of this invention, it is an extended application for FIG. 3A and FIG. 3B. As shown in FIG. 3C, a first signal wire 211 is disposed on the top layer of a circuit board and is connected to a capacitive structure 23. A second signal wire 311 is disposed on the bottom layer of the circuit board and is connected to the other capacitive structure which is open is easy for designing the layout of the second signal wire 311. Wherein the capacitive structure 23 and the capacitive structure on the bottom layer are capacitive coupled between the first signal wire 211 and the second signal wire 311.

Furthermore, the capacitive structure on the bottom layer is connected to the first capacitive cylinder 33, and the first capacitive cylinder 33 passes through toward the capacitive structure 23. The capacitive structure 23 connects to the second capacitive cylinder 231, and the second capacitive cylinder 231 connects between the capacitive structure 23 and the capacitive structure on the bottom layer. Accordingly, the first capacitive cylinder 33 and the second capacitive cylinder 231 are capacitive coupled between the first signal wire 211 and the second signal wire 311.

Figure 3D:
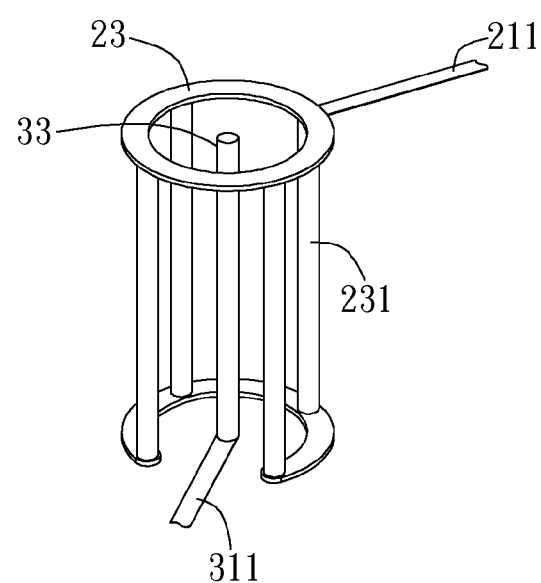
FIG. 3D is a schematic diagram in another embodiment of this invention.

In other embodiment, to further increase the capacitance, the number of the capacitive cylinder between the capacitive structures can be increased. As shown in FIG. 3D, setting 4 second capacitive cylinders 231 between the top capacitive structure and the bottom capacitive structure. Accordingly, the first capacitive cylinder 33 and 4 second capacitive cylinders 231 are capacitive coupled. Wherein the number of the capacitive cylinder can be designed by needed.

Figure 4:
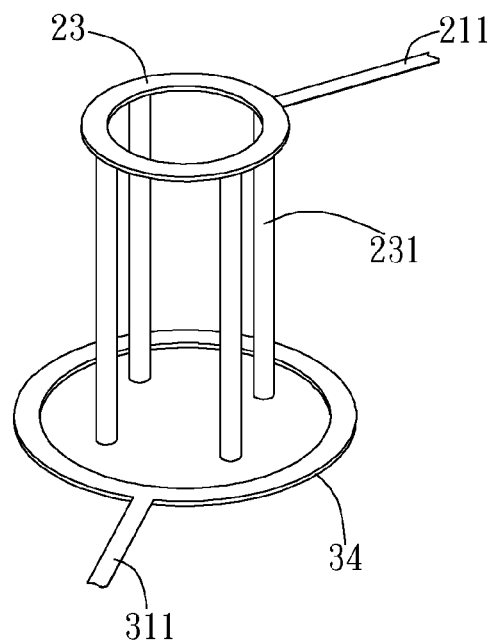
FIG. 4 is a schematic diagram in another embodiment of this invention.

In another embodiment, as shown in FIG. 4, the first capacitive structure 23 connects to the first signal wire 211, at least one capacitive cylinder 231 (take 4 for example) connects to the first capacitive structure 23, and the second capacitive structure 34 connects to the second signal wire 311. In this embodiment, the area of the second capacitive structure 34 is larger than the area of the first capacitive structure 23. The second capacitive structure 34 surrounds the first capacitive structure 23. Accordingly, the first capacitive structure 23 and the second capacitive structure 34 are capacitive coupled between the first signal wire 211 and the second signal wire 311, and the at least one capacitive cylinder 231 and the second capacitive structure 34 are also capacitive coupled between the first signal wire 211 and the second signal wire 311.

Figure 5:
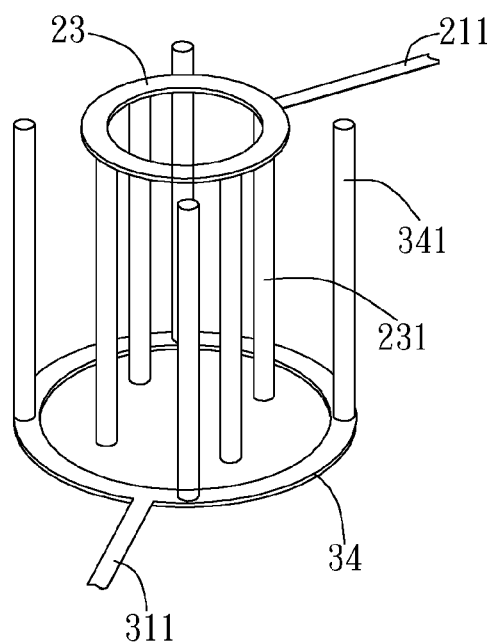
FIG. 5 is a schematic diagram in another embodiment of this invention.

As shown in FIG. 5, in another embodiment, the structure is similar to the embodiment of FIG. 4. In this embodiment, further to increase the capacitive cylinder on a second capacitive structure 23 to increase the capacitance. As shown in FIG. 5, a first capacitive structure 23 connects to a first signal wire 211; at least one first capacitive cylinder 231 connects to the first capacitive structure 23; a second capacitive structure 34 connects to a second signal wire 311; at least one second capacitive cylinder 341 connects to the second capacitive structure 34. The second capacitive structure 34 surrounds the first capacitive cylinder 231. According to this design, the first capacitive cylinder 231 and the second capacitive cylinder 341 are capacitive coupled between the first signal wire 211 and the second signal wire 311.

Figure 6:
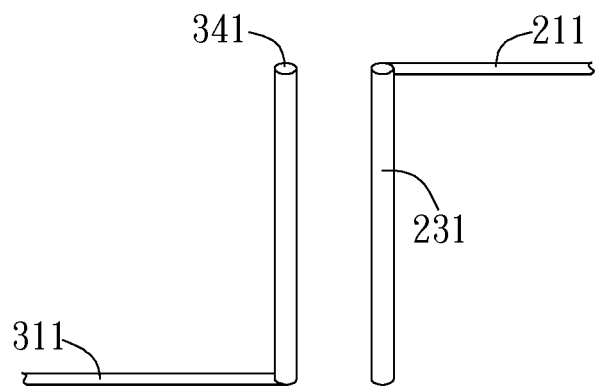
FIG. 6 is a schematic diagram in another embodiment of this invention.

In another simple embodiment of this invention, as shown in FIG. 6, that is, a first capacitive cylinder 231 connected to a first signal wire 211 is capacitive coupled with a capacitive cylinder 341 connected to a second signal wire 311.

It is noted that all above embodiments can be integrated into a circuit board 2 in FIG. 2A.

It is worth mentioned that the circular capacitive structure may be performed on multi-layer printed circuit board. For example, multiple circular capacitive structures are capacitive coupled with a capacitive cylinder. The principle is the same as the above embodiment.

Figure 1A:
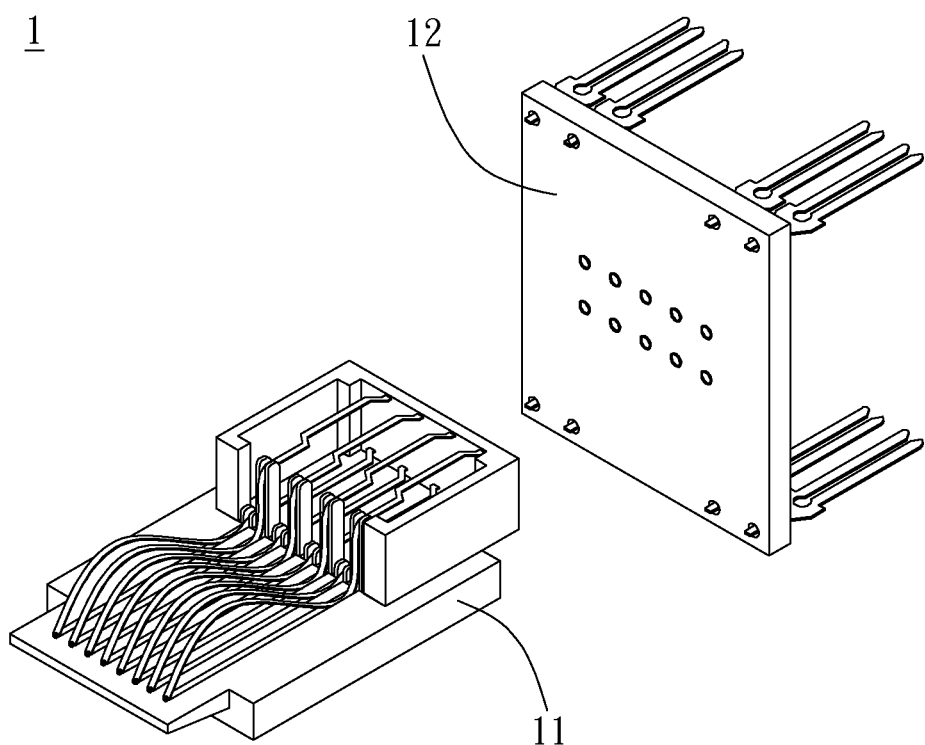
FIG. 1A is a schematic diagram of a general connector.
Figure 1B:
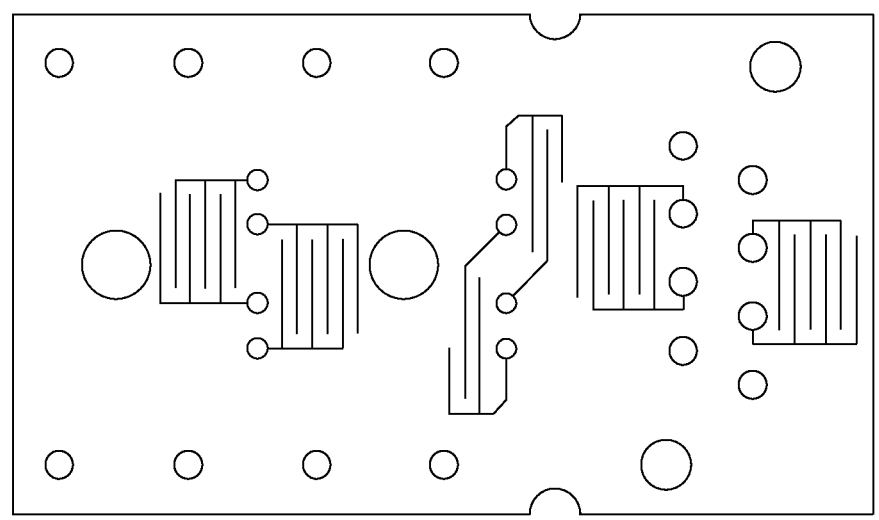
FIG. 1B is a schematic diagram of a general interdigital capacitor.
Figure 1C:
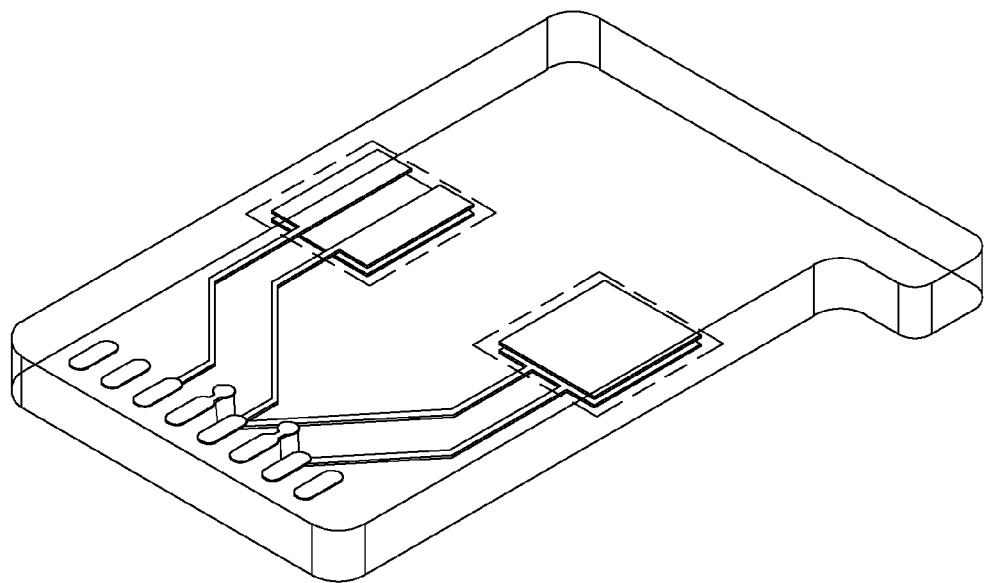
FIG. 1C is a schematic diagram of a general parallel plate capacitor.
Figure 1D:
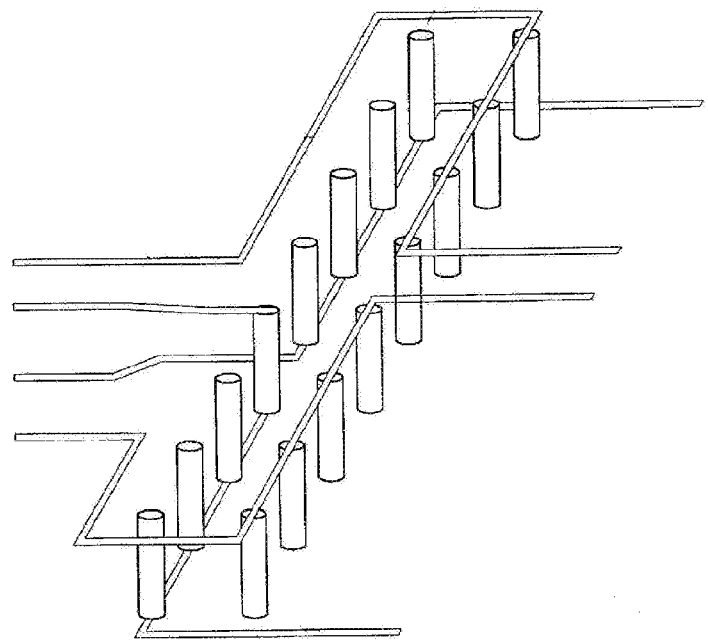
FIG. 1D is a schematic diagram of a general via capacitor.
Figure 7:
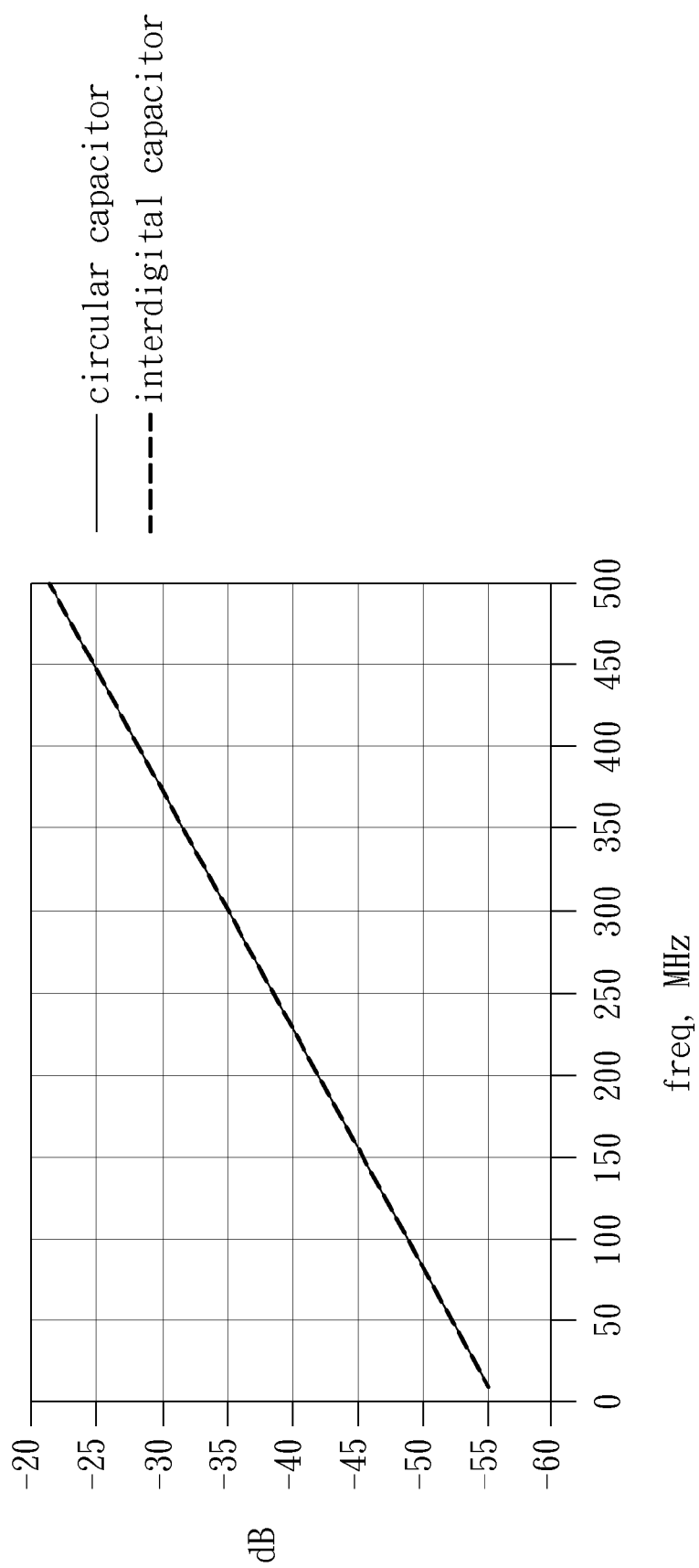
FIG. 7 is a measuring diagram in one embodiment of this invention.

By using this design of the circular capacitor and the capacitive cylinder in this invention, the capacitance area efficiency can be raised significantly. As shown in FIG. 7, when assuming that the area of an interdigital capacitor in FIG. 1C is 8.68 mm$^2$ and the area of a circular capacitor in FIG. 3D is 1.88 mm$^2$, by a measuring result in FIG. 7 it can be found that the circular capacitor (active line) has almost the same crosstalk value as the interdigital capacitor (dash line) while the area of the circular capacitor is about 3.12 times smaller than the area of the interdigital capacitor.

Figure 8:
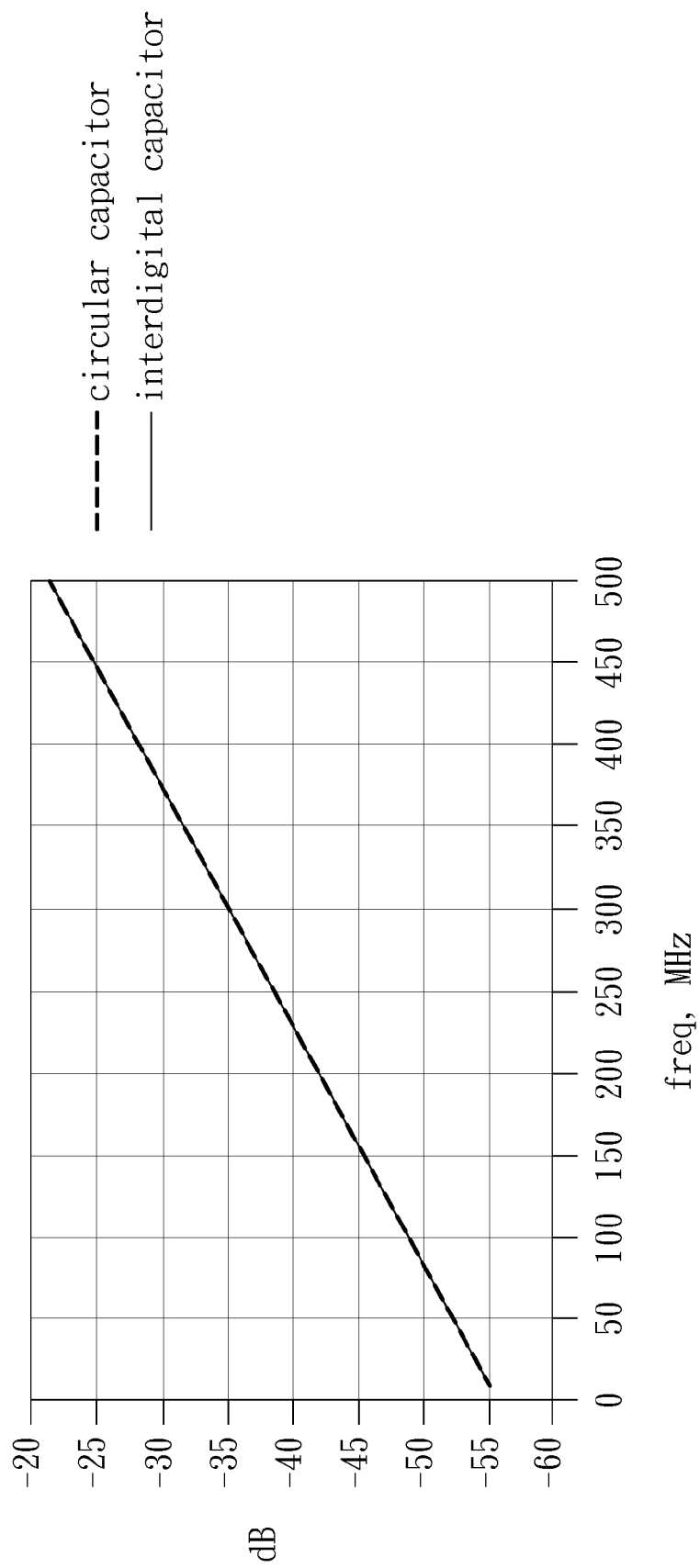
FIG. 8 is a measuring diagram in another embodiment of this invention.

FIG. 8 is a schematic diagram that testing two layer of an interdigital capacitor. The area of this capacitor is 4.8 mm$^2$, and the area of a circular capacitor is 1.88 mm$^2$ as set forth above. By a measuring result in FIG. 8, the circular capacitor (active line) has almost the same crosstalk value as the interdigital capacitor (dash line) while the area of the circular capacitor is about 1.73 times smaller than the area of the interdigital capacitor.

Figure 9:
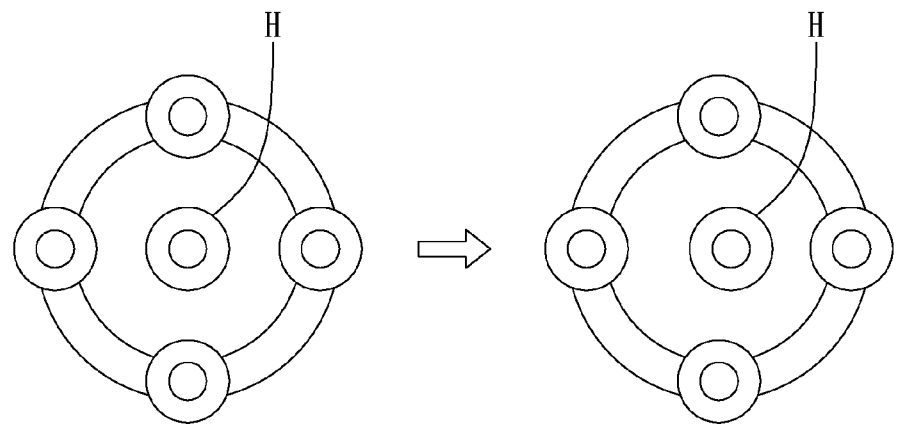
FIG. 9 is a measuring diagram in another embodiment of this invention.
Figure 9:
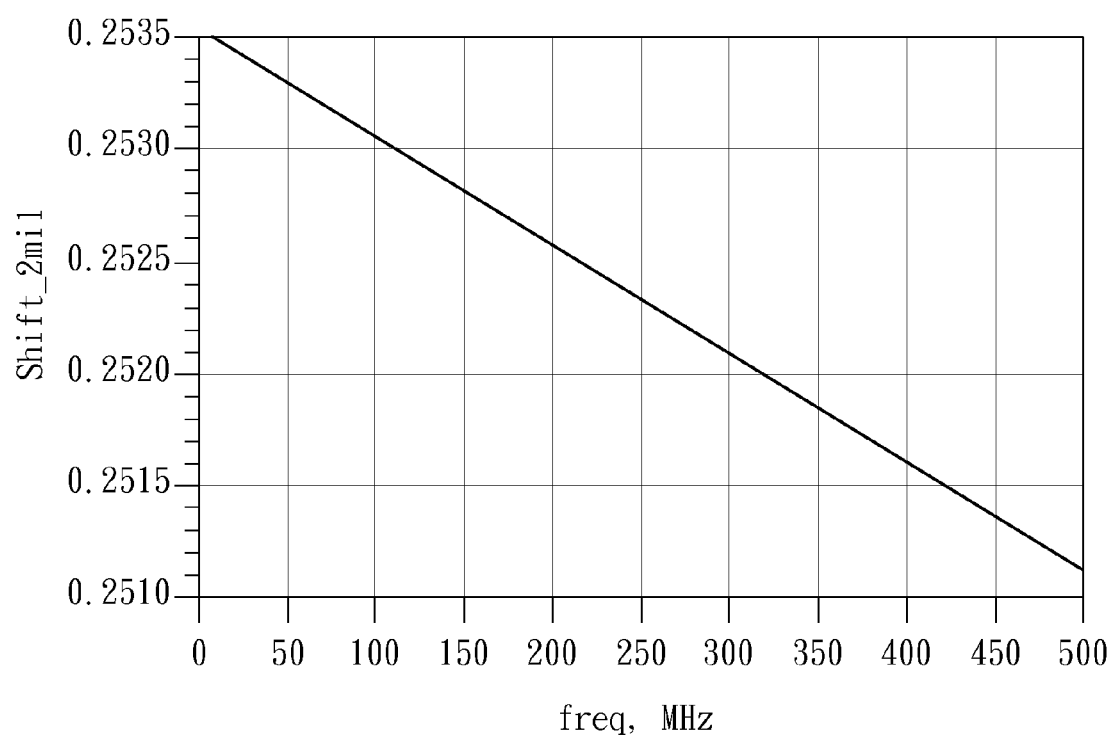

Another advantage in this invention is to reduce the capacitance error from process. As shown in FIG. 9, when the drilling position of the capacitor cylinder H is 2 mil shifted, by a measuring result, the capacitance variation is about only 0.25%. The principle is that when H is shifted toward one position, the distance becomes short, and the capacitance increases. But in the meantime, H is shifted away from the other position, the distance increases, and the capacitance decreases. Accordingly, the increasing and the decreasing of the capacitance can be offset.

Figure 10:
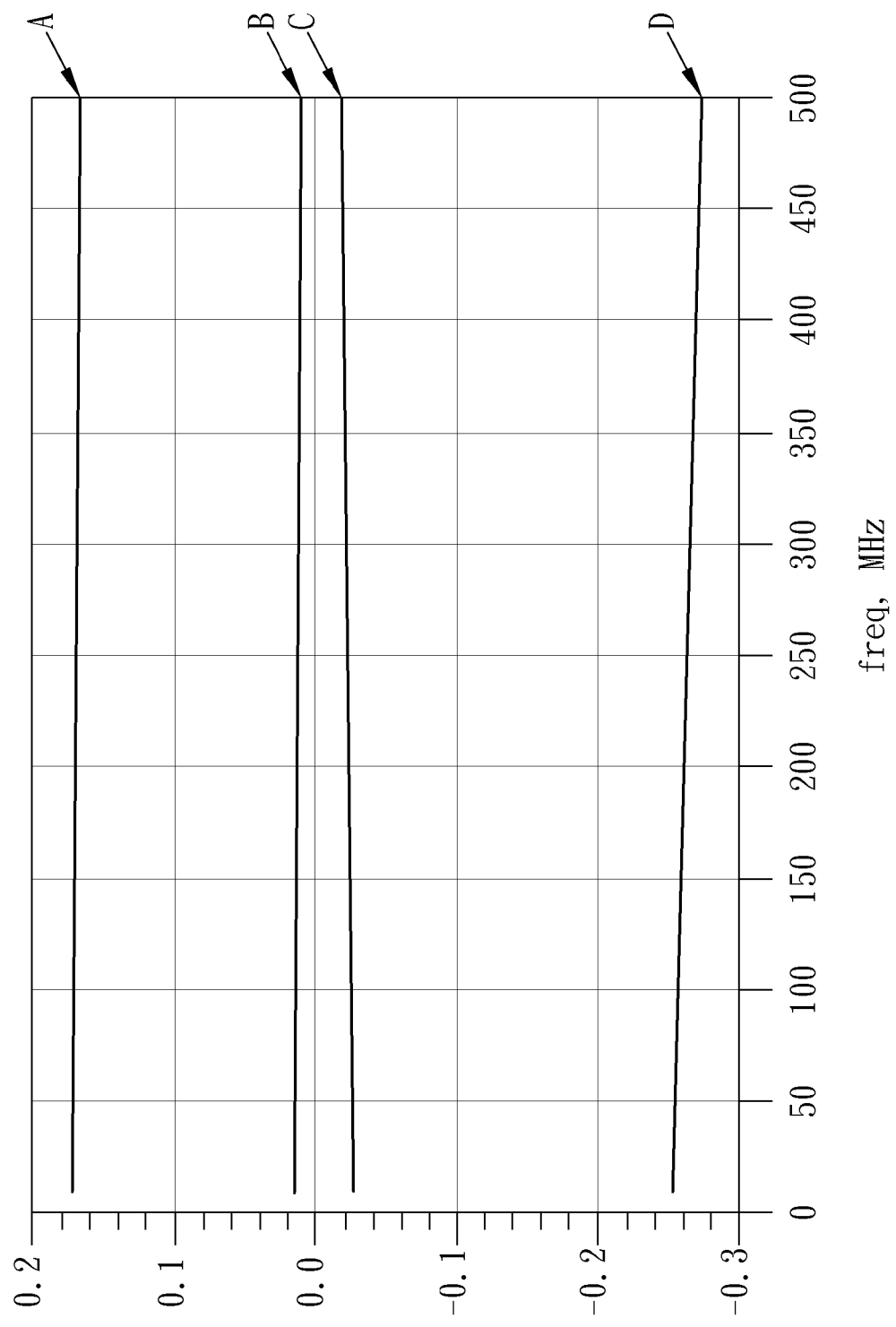
FIG. 10 is a measuring diagram in another embodiment of this invention.

Furthermore, if the width of the metal wire has error by processing, it also can be reduced through this invention. By a measuring data shown in FIG. 10, A presents the capacitance variation when the width is 10% increased. By measuring, the capacitance variation is about 0.17% at 500 MHz. B presents the capacitance variation when the width is 20% increased. By measuring, the capacitance variation is about 0.02% at 500 MHz. C presents the capacitance variation when the width is 10% decreased. By measuring, the capacitance variation is about 0.01% at 500 MHz. D presents the capacitance variation when the width is 20% decreased. By measuring, the capacitance variation is about 0.27% at 500 MHz.

In comparison to the prior art, the circuit board for the communication connector in the invention can effectively raise the area usage of the circuit board and reduce the capacitive deviation from process by using the circular capacitor and the via capacitor.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A circuit board for a communication connector, comprising:
    a first signal input terminal and a first signal output terminal;
    a first signal wire is configured to connect the first signal input terminal to the first signal output terminal;
    a second signal input terminal and a second signal output terminal;
    a second signal wire is configured to connect the second signal input terminal to the second signal output terminal;
    a capacitive structure, connecting to the first signal wire; and
    a capacitive cylinder, connecting to the second signal wire;
    wherein the capacitive structure and the capacitive cylinder are capacitive coupled between the first signal wire and the second signal wire.

2. The circuit board as claimed in claim 1, wherein the capacitive structure comprises at least one circular structure.

3. The circuit board as claimed in claim 1, wherein the capacitive structure comprises at least one rectangle structure or polygon structure.

4. The circuit board as claimed in claim 2 or 3, wherein the capacitive structure is close or open.

5. The circuit board as claimed in claim 4, wherein the capacitive structure surrounds the capacitive cylinder.

6. A circuit board for a communication connector, comprising:
- a first signal input terminal and a first signal output terminal;
- a first signal wire is configured to connect the first signal input terminal to the first signal output terminal;
- a second signal input terminal and a second signal output terminal;
- a second signal wire is configured to connect the second signal input terminal to the second signal output terminal;
- a capacitive structure, connecting to the first signal wire;
- a first capacitive cylinder, connecting to the second signal wire; and
- at least one second capacitive cylinder, connecting to the capacitive structure;

wherein the at least one second capacitive cylinder and the first capacitive cylinder are capacitive coupled between the first signal wire and the second signal wire.

7. The circuit board as claimed in claim 6, wherein the capacitive structure comprises at least one circular structure.

8. The circuit board as claimed in claim 6, wherein the capacitive structure comprises at least one rectangle structure or polygon structure.

9. The circuit board as claimed in claim 7 or 8, wherein the capacitive structure is close or open.

10. The circuit board as claimed in claim 9, wherein the capacitive structure surrounds the first capacitive cylinder.

11. A circuit board for a communication connector, comprising:
- a first signal input terminal and a first signal output terminal;
- a first signal wire is configured to connect the first signal input terminal to the first signal output terminal;
- a second signal input terminal and a second signal output terminal;
- a second signal wire is configured to connect the second signal input terminal to the second signal output terminal;
- a first capacitive structure, connecting to the first signal wire;
- at least one capacitive cylinder, connecting to the first capacitive structure; and
- a second capacitive structure, connecting to the second signal wire;

wherein the first capacitive structure and the second capacitive structure are capacitive coupled between the first signal wire and the second signal wire, and the at least one capacitive cylinder and the second capacitive structure are capacitive coupled between the first signal wire and the second signal wire.

12. The circuit board as claimed in claim 11, wherein the first capacitive structure or the second capacitive structure comprises at least one circular structure.

13. The circuit board as claimed in claim 11, wherein the first capacitive structure or the second capacitive structure comprises at least one rectangle structure or polygon structure.

14. The circuit board as claimed in claim 12 or 13, wherein the first capacitive structure or the second capacitive structure is close or open.

15. The circuit board as claimed in claim 14, wherein the second capacitive structure surrounds the at least one first capacitive cylinder.

16. A circuit board for a communication connector, comprising:
- a first signal input terminal and a first signal output terminal;
- a first signal wire is configured to connect the first signal input terminal to the first signal output terminal;
- a second signal input terminal and a second signal output terminal;
- a second signal wire is configured to connect the second signal input terminal to the second signal output terminal;
- a first capacitive structure, connecting to the first signal wire;
- a second capacitive structure, connecting to the second signal wire;
- at least one first capacitive cylinder, connecting to the first capacitive structure; and
- at least one second capacitive cylinder, connecting to the second capacitive structure;

wherein the at least one first capacitive cylinder and the at least one second capacitive cylinder are capacitive coupled between the first signal wire and the second signal wire.

17. The circuit board as claimed in claim 16, wherein the first capacitive structure or the second capacitive structure comprises at least one circular structure.

18. The circuit board as claimed in claim 16, wherein the first capacitive structure or the second capacitive structure comprises at least one rectangle structure or polygon structure.

19. The circuit board as claimed in claim 17 or 18, wherein the first capacitive structure or the second capacitive structure is close or open.

20. The circuit board as claimed in claim 19, wherein the second capacitive structure surrounds the at least one first capacitive cylinder.

* * * * *